United States Patent [19]
Katayama et al.

[11] Patent Number: 6,107,951
[45] Date of Patent: Aug. 22, 2000

[54] REMOTE CONTROL SIGNAL TRANSMISSION DEVICE

[75] Inventors: Kenichi Katayama, Kanagawa; Masayuki Kihara, Saitama; Tetsuya Nakamura, Ibaraki, all of Japan

[73] Assignee: Sony Corporation, Tokyo, Japan

[21] Appl. No.: 09/007,540

[22] Filed: Jan. 15, 1998

[30] Foreign Application Priority Data

Jan. 16, 1997 [JP] Japan ..................................... 9-005883

[51] Int. Cl.$^7$ .................................................. G08C 19/12
[52] U.S. Cl. ............... 341/176; 340/825.57; 340/825.69; 340/825.72; 348/734
[58] Field of Search ....................... 341/176; 340/825.69, 340/825.72, 825.57; 348/734

[56] References Cited

U.S. PATENT DOCUMENTS

| | | | |
|---|---|---|---|
| 4,623,887 | 11/1986 | Welles, II | 340/825.57 |
| 4,626,848 | 12/1986 | Ehlers | 340/825.69 |
| 4,825,200 | 4/1989 | Evans | 341/23 |
| 4,959,810 | 9/1990 | Darbee | 340/825.69 |
| 5,412,377 | 5/1995 | Evans | 340/825.22 |
| 5,451,953 | 9/1995 | Duffield | 341/176 |

FOREIGN PATENT DOCUMENTS

0 331 257  9/1989  European Pat. Off. .

*Primary Examiner*—Michael Horabik
*Assistant Examiner*—Albert K. Wong
*Attorney, Agent, or Firm*—Ronald P. Kananen; Rader, Fishman & Grauer

[57] ABSTRACT

A remote control signal transmission device includes a plurality of operation keys; a detector for detecting which operation keys have been operated; a memory for storing correspondence tables between the operation keys and remote control signals, with each of the correspondence tables differing depending on an electronic apparatus taken as a remote control target; a setter that receives a detection output of the detector and, when consecutive operation of a pre-defined plurality of said operation keys is detected as the detection output, selects a correspondence table for an electronic apparatus corresponding to the consecutive operation from within a plurality of the correspondence tables stored in the memory; a remote control signal generator, the signal from which corresponds to an operated key according to a correspondence table set by the setter and transmitting the remote control signal to electronic apparatus taken as the control target; and a setting protector for protecting settings of the setting means.

14 Claims, 7 Drawing Sheets

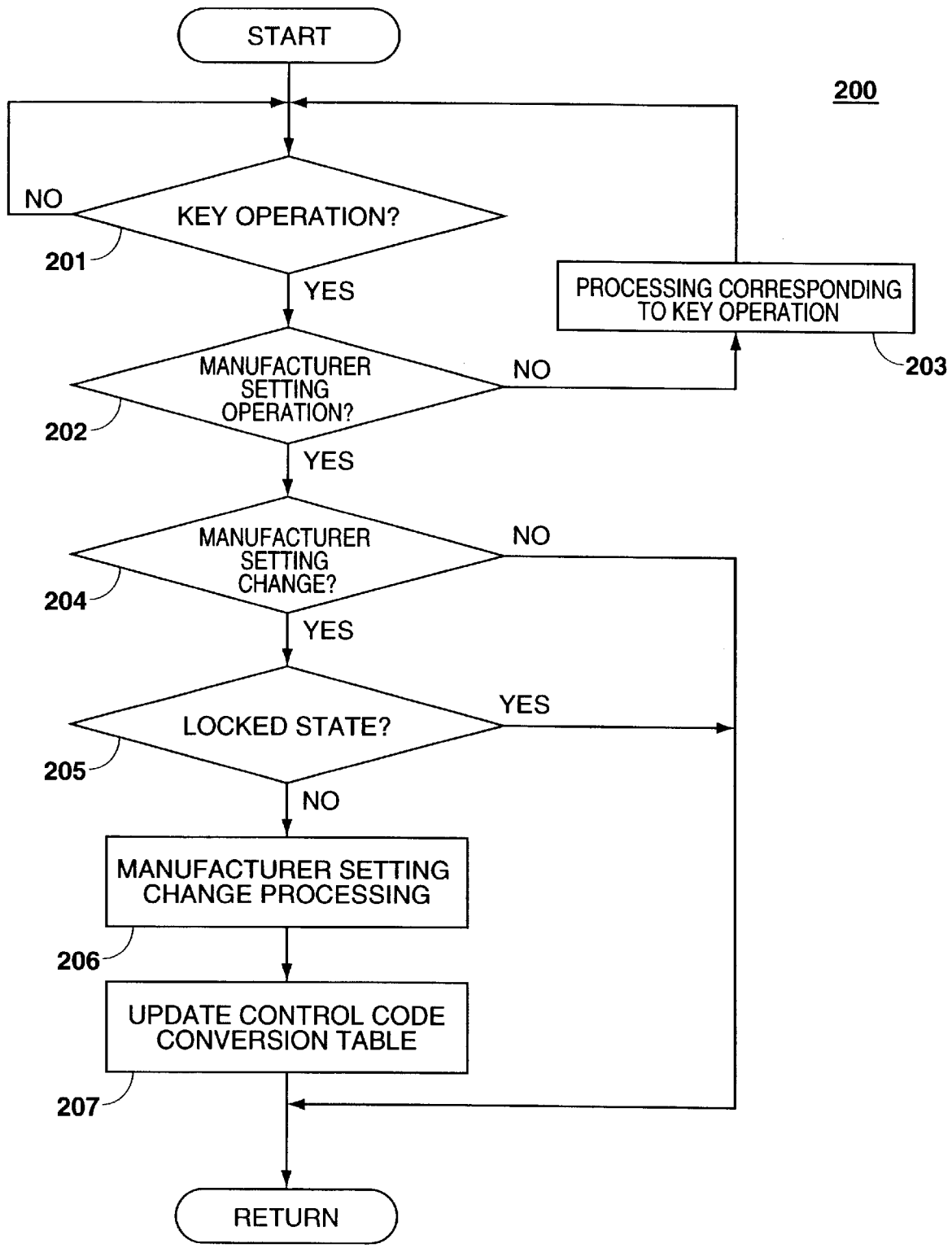

REMOTE CONTROL SIGNAL TRANSMISSION DEVICE

BACKGROUND OF THE INVENTION

1. Field of the Invention

The present invention relates to a remote control signal transmission device capable of being compatible with, for example, television receivers of a plurality of manufacturers.

2. Description of Related Art

Various control operations such as the turning on and off of the power supply, station selection and sound volume adjustment are usually carried out by a viewer of a conventional television receiver using transmission of remote control signals from a remote control unit of a wireless transmission device (hereinafter referred to as a remote commander).

When station selections, channel settings, are made frequently, the channel setting can be carried out by direct station selection using so-called numeric keys corresponding to numerals of, for example, [1] to [12], or stepped up/down station selection using a see-saw type operation key or a pair of mechanically independent operation keys.

When both of direct station selection and up/down station selection are adopted, the up/down station select keys are arranged in a position that provides ease of operation and the size of these keys is often made large.

Further, it is usual for the remote commanders to adopt stepped up/down control using see-saw type or independent operation keys for sound volume adjustment involving a high degree of setting freedom and a high frequency of operation.

The operation keys for sound volume adjustment are also to be arranged at a position that provides ease of operation.

Video Tape Recorders (VTRs) are also controlled in channel setting during picture recording, sound volume adjustment during playback and the tape transport etc. using a similar remote commander.

Further, the code format of the remote control signal also differs depending on the manufacturer of the television receiver etc.

Recently, however, pre-programmable remote commanders referred to as universal remote controllers that are compatible with television receivers of a plurality of manufacturers have come on the market. These types of remote commanders come mounted with memory for storing a plurality of code conversion tables so as to provide compatibility with the control codes of each manufacturer.

Before starting to use the remote commander, the manufacturer of, for example, a television receiver that is to become the control target is selected by the user and a code conversion table corresponding to this manufacturer is entered (manufacturer setting). When this manufacturer setting is completed, remote control signals are transmitted from the remote commander with the code format for the manufacturer entered.

A code table of registration numbers corresponding to a plurality of manufacturers is usually given in operation manuals for pre-programmable remote commanders, with the user then being able to carry out manufacturer setting by referring to this code table.

Although the procedures for setting the manufacturer of, for example, television receivers differ depending on the pre-programmed remote commander, one example is as follows.

a. one or two digits of numerals of manufacturer code corresponding to the desired manufacturer are inputted while pressing the TV power supply key of the remote commander.

b. numerals of manufacturer code corresponding to the desired manufacturer are inputted two or three times while pressing the TV power supply key of the remote commander.

c. one or two digits of numerals of manufacturer code corresponding to the desired manufacturer are input while pressing the setting key of the remote commander.

d. one or two digits of numerals of manufacturer code corresponding to the desired manufacturer are inputted while pressing the setting key of the remote commander and the enter key is finally pressed.

However, with the above pre-programmed remote commander, there can be cases where a setting can be released, or one of the above procedures a to d for another manufacturer setting can be accidentally executed to cause setting of undesired manufacturer while, for example, a small child is playing with the remote commander after the desired manufacturer settings have been carried out.

In view of the foregoing, it is an object of the present invention to provide a remote control signal transmission device capable of ensuring that accidental release of the setting of the manufacturer or the setting of an undesired manufacturer does not occur after setting of the manufacturer of the remote commander has been carried out.

SUMMARY OF THE INVENTION

In order to accomplish the aforementioned object, a remote control signal transmission device of the present invention comprises:

a plurality of operation keys;

an operation key detector for detecting which of a plurality of the operation keys have been operated;

a storage for storing correspondence tables between the operation keys and remote control signals for a plurality of manufacturers of electronic apparatus, each of the correspondence tables differing depending on a manufacturer of an electronic apparatus taken as a remote control target;

manufacturer setting device which receives a detection output of the operation key detector and, when consecutive operation of a pre-defined plurality of the operation keys is detected as the detection output, selects a correspondence table for a manufacturer corresponding to the consecutive operation from within a plurality of the correspondence tables stored at the storage to set the manufacturer;

a device for generating a remote control signal corresponding to an operated key according to a correspondence table set by the manufacturer setting device and transmitting the remote control signal to electronic apparatus taken as the control target when an operation of any of a plurality of the operation keys is detected by the operation key detector; and a setting protection device for protecting settings of the manufacturer setting means.

With the remote control signal transmission device of the present invention, the setting of the manufacturer (manufacturer setting) once set by the setting protection device can be kept locked unless a scheduled lock release of the setting is carried out by the setting protection device. This can therefore prevent misoperation of releasing manufacturer settings or bringing the setting to that of the incorrect manufacturer.

BRIEF DESCRIPTION OF THE DRAWINGS

FIG. 7 is a flowchart illustrating the operation of the embodiment of FIG. 6.

DETAILED DESCRIPTION OF THE PREFERRED EMBODIMENTS

First Embodiment

Figure 1:
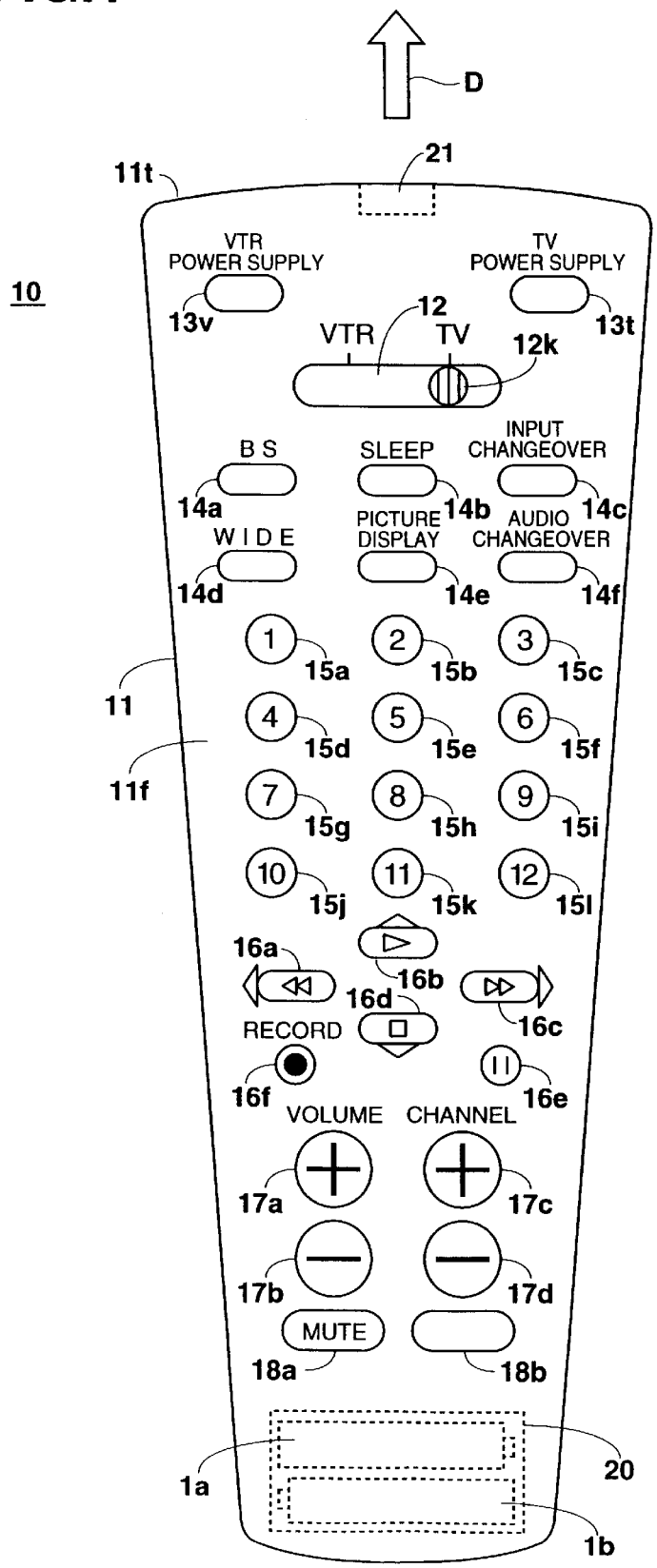
FIG. 1 is a front view showing a configuration of the first embodiment of a remote control signal transmission device according to the present invention.
Figure 2A:
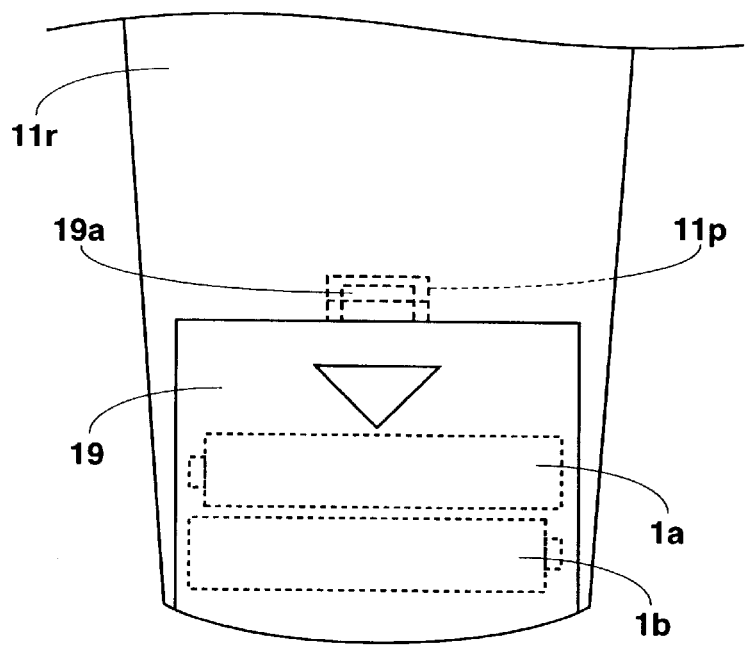
FIG. 2A and FIG. 2B are reverse surface views showing the configuration of the essential portion of the first embodiment of the device according to the present invention.
Figure 2B:
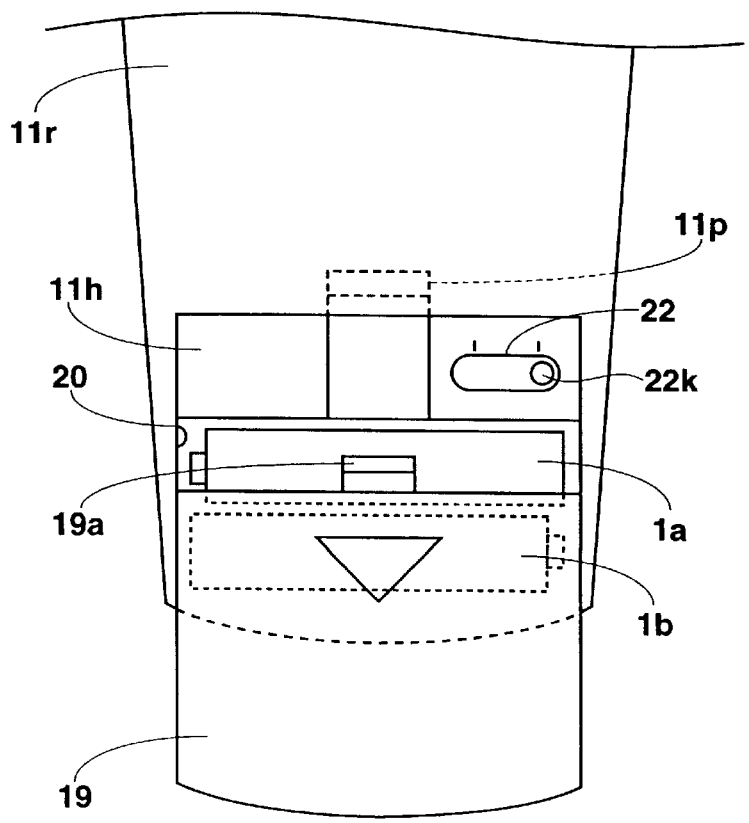
Figure 3:
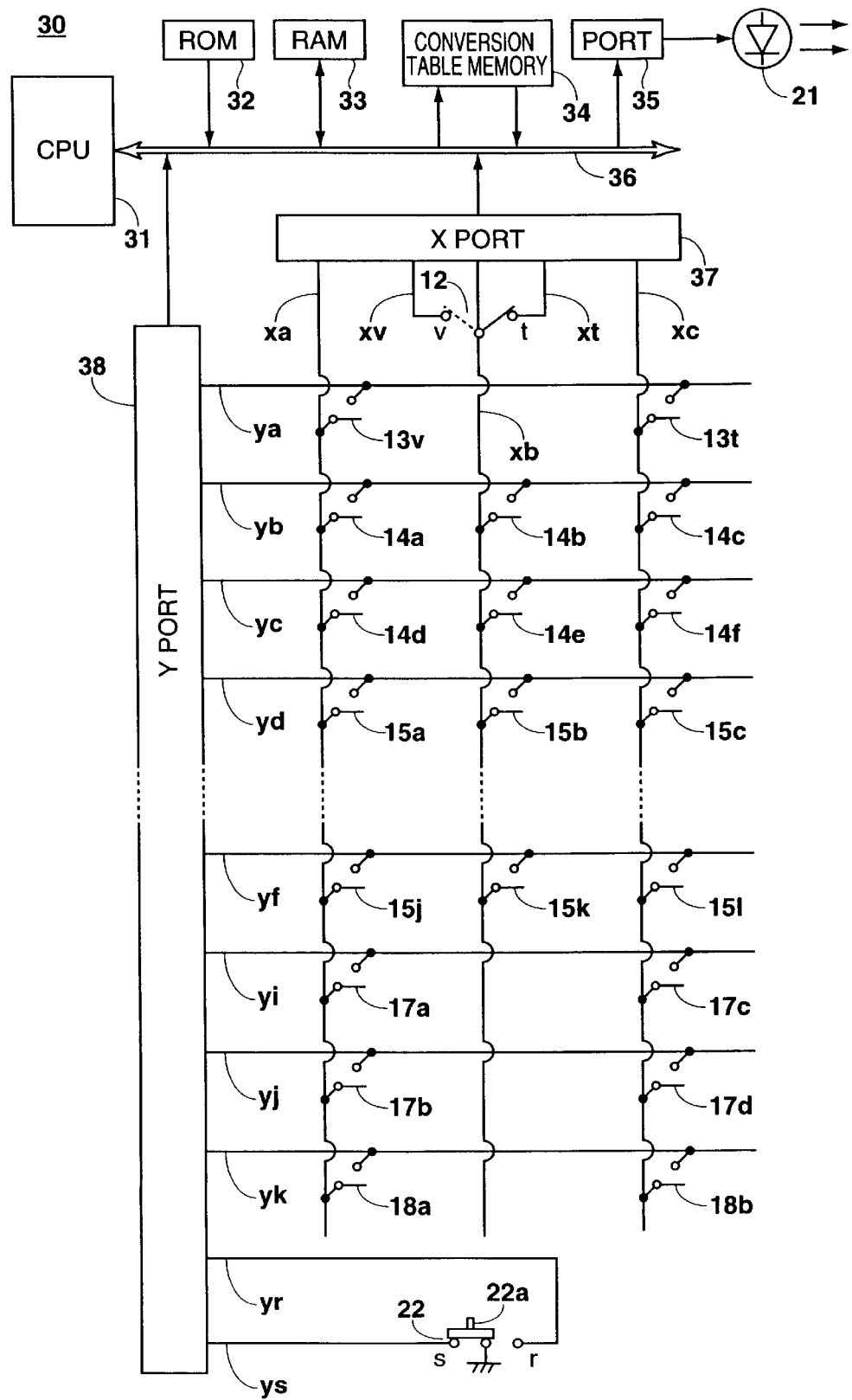
FIG. 3 is a block diagram showing the electrical configuration of the first embodiment of the present invention.

The following is a description with reference to FIG. 1 to FIG. 3 of an embodiment of a remote control signal transmission device according to the present invention.

The entire configuration of the embodiment of the present invention is shown in FIG. 1, the configuration of essential part is shown in FIGS. 2A and 2B, and the electrical configuration is shown in FIG. 3.

In FIG. 1, a knob 12k for changing over a slide type switch 12 for selecting a television receiver or video tape recorder as the control target and power supply keys 13t and 13v for controlling the power supplies of the television receiver and the video tape recorder to go on and off are arranged at an upper end of a front surface 11f of a synthetic resin case 11 of a remote commander 10. Various types of main function keys 14a to 14h are then separately arranged at the front surface 11f of the case 11.

Here, key 14a is a changeover key for receiving BS (Broadcast Satellite) broadcasts, key 14b is a sleep key for switching off the power supply of the television receiver or the video tape recorder after, for example, one hour, key 14c is an input changeover key for changing over external input terminals of the television receiver or the video tape recorder, key 14d is a changeover key for receiving wide screen television signals, key 14e is a picture display key for changing over whether or not to display a channel number in the television picture and key 14f is a main/sub audio channel changeover key.

At the part under the function keys 14a to 14h, are arranged numeric keys 15a, 15b, . . . , 15k, 15l with respective numerals from [1] to [12] corresponding to channel numbers for the television receiver for directly selecting channels, a rewind key 16a for control, a forward key 16b, a fast forward key 16c, a stop key 16d, a pause key 16e and a picture record key 16f for tape transport control for the video tape recorder, together with up and down keys 17a and 17b for sound volume adjustment and a channel up key 17c and a channel down key 17d for station selection.

Copy function keys 18a and 18b are arranged at the lower part from the above keys. Key 18a is a mute key for ensuring that audio is not generated from the television receiver (or the video tape recorder), key 18b is a recall key for recalling the channel immediately previous to the channel currently being received by, for example, the television receiver.

As shown by the dashed lines at the lower part of the case 11 in FIG. 1, there is provided a dry cell holder 20 for housing dry cells 1a and 1b that operate as the power supply for the remote commander 10.

As shown in FIG. 2A, the dry cell holder 20 is covered by a dry cell holder cover 19 made of synthetic resin provided at reverse surface 11r of the case 11. When the dry cells 1a and 1b are changed, interlocking of a dry cell holder catch 19a formed as part of the one-piece molded dry cell holder cover 19 and an interlocking part 11p provided at the inside of the reverse surface 11r of the case 11 is released.

The interlocking is released by pressing the upper part of the dry cell holder cover 19, where the catch 19a of the dry cell holder cover 19 is interlocked with the interlocking part 11p, against the force caused by the elasticity of the dry cell holder cover 19 of synthetic resin and by further sliding the dry cell holder cover 19 in a downward direction. FIG. 2B shows the dry cell holder cover 19 being released from the interlocking and slid in the downward direction.

Further, as shown in FIG. 1, a light emitting diode 21 is arranged at an upper end 11t of the case 11, with a remote control signal of infrared radiation being transmitted from the light emitting diode 21 in the direction of the arrows in response to operations of each of the aforementioned keys 13 to 17.

In this embodiment, as shown in FIG. 2B, a slide type changeover switch 22, which prevents erroneous release by locking manufacturer settings as above mentioned, is provided at a portion 11h adjacent to the dry cell holder 20 and usually covered by the dry cell holder cover 19 at the reverse surface 11r of the case 11. The changeover switch 22 can then be switched over by moving a switch operation knob 22k to the leftward and rightward.

As shown in FIG. 3, a microcomputer 30 is loaded at the aforementioned remote commander 10 of this embodiment. This microcomputer 30 is equipped with a CPU 31, a ROM 32 for storing various control programs, a RAM 33 mainly utilized as a work region for operations, a non-volatile conversion table memory 34 for storing a plurality of code conversion tables corresponding to control codes of each manufacturer and an output port 35 to which the light emitting diode 21 is connected, with each of these being connected to a system bus 36.

The microcomputer 30 is equipped with an X port 37 and a Y port 38. The operation keys 13t, 13v, 14a to 14f, 15a to 15l, 16a to 16e, 17a to 17d, 18a and 18b of the remote commander 10 shown in FIG. 1 are taken to be switch keys of switches that are normally open. These switch keys are arranged opposite to the switches in a matrix at the intersections of the connection lines xa to xc of the X port 37 and connection lines ya to ys of the Y port 38 as shown in FIG. 3.

In the example in FIG. 3, a connection line xb is connected to either one of connection lines xt and xv by the switch 12 shown as a single pole double throw type and one of either the television receiver or the video tape recorder is selected as the control target. Together with this, one of either of the connection lines yr and ys is connected to earth by the changeover switch 22 and data setting relating to the aforementioned manufacturer for the television receiver or the video tape recorder is locked for being protected or released as a result of being switched over.

For simplicity, the switch 12 has been shown as a one circuit two connection type in FIG. 3, but a changeover switch of a type of a one circuit three connection or more can also be used when three or more apparatus are taken as control targets for the remote commander.

Next, a description will be given of the manufacturer settings for the remote commander of this embodiment and the locking of these settings.

When any of the large number of keys are not pressed at the remote commander of this embodiment, the microcomputer 30 is in a sleep mode. When an arbitrary key is then pressed, the microcomputer enters in an operating state, the X port 37 and Y port 38 are scanned by the CPU 31 and the position of the pressed key is detected.

Before the manufacturer settings are carried out, the dry cell holder cover 19 is opened, the knob 22k of the changeover switch 22 is changed over to the side of the contact point r so as to be the opposite of that shown in FIG. 3, and the lock is released.

The connection of the switch 12 is made to the side of the contact point t as shown in FIG. 3 in the case of manufacturer settings for a television receiver.

Next, when the power supply key 13t and one of the numeric keys 15 are simultaneously pressed, this simultaneous pressing is detected by the CPU 31 and the desired television receiver manufacturer code is selectively inputted.

This remote commander 10 is configured in such a manner that the pause key 16e also functions as an input deciding key. Therefore, after the aforementioned selective inputting, when the deciding key 16e is pressed, this pressing is detected by the CPU 31, the code conversion table corresponding to the desired manufacturer of the plurality of code conversion tables stored in the memory 34 is entered and setting of the manufacturer of the television receiver is complete.

In the above embodiment, the numeric keys 15a to 15l correspond to respective television receiver manufacturers A to L so that, for example, when the numeric key 15k is pressed together with the power supply key 13t at the same time, the manufacturer K is set.

When the manufacturer settings are complete and the knob 22k of the changeover switch 22 is moved over so as to make a connection to the side of contact point s as shown in FIG. 3, this connection state is detected at the CPU 31 and the memory 34 is locked. Release or change of the manufacturer settings is prohibited in this locked state and data relating to current manufacturer settings is protected.

When it becomes necessary to change the manufacturer setting as a result of buying a television receiver of a manufacturer different from that of the receiver having been used up until that time, the changeover switch 22 is changed over to the side of contact point r, the locked state of the memory 34 is released and setting of the new manufacturer can be carried out by the above procedure.

In the case of setting the manufacturer for a video tape recorder, the switch 12 is changed over to the side of contact point v so as to be the reverse of that shown in FIG. 3 and, in place of the power supply key 13t for the above setting procedure, the power supply key 13v for use with the video tape recorder is pressed simultaneously with the numeric keys 15 so as to selectively input the desired manufacturer.

Like in the above description, setting of the manufacturer is then completed by pressing the deciding key 16e and the memory 34 is locked by making the connection of the changeover switch 22 to the contact point s.

In this embodiment, locking and releasing of manufacturer settings is carried out using the knob 22k of the changeover switch 22 arranged at a portion 11h covered by the dry cell holder cover 19 at the reverse surface 11r of the case 11 of the remote commander 10. Consequently, even in the case, for example, that a child randomly operates operation keys on the front surface 11f of the case 11, the changeover switch 22 cannot be touched and the mistaken release of manufacturer settings and the setting of undesired manufacturers can be prevented. This improves the remote commander in convenience as well as in reliability.

Second and Third Embodiments

In the above first embodiment, the changeover switch 22 is arranged at the portion 11h covered by the dry cell holder cover 19 at the reverse surface 11r of the case 11 of the remote commander 10. In the second embodiment shown in FIG. 4, however, an operation key 23K with less surface area compared with other keys is arranged at the front surface 11f of the case 11 of a remote commander 10A for a switch that changes over between off and on upon each pressing.

Figure 4:
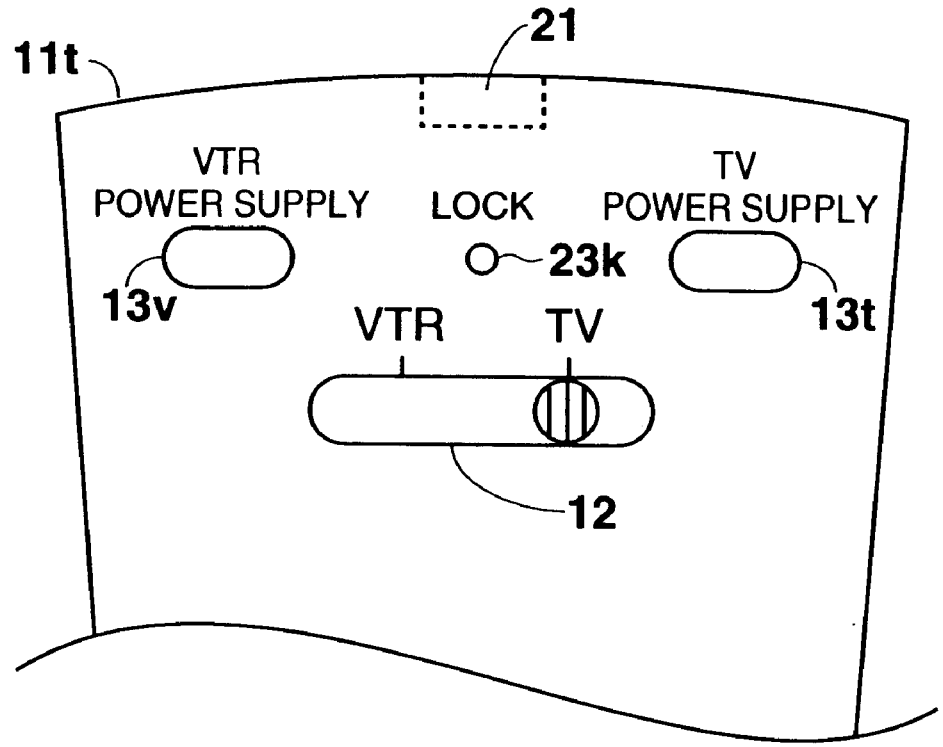
FIG. 4 is a front view showing a configuration of the essential portion of the second embodiment of the device according to the present invention.
Figure 5A:
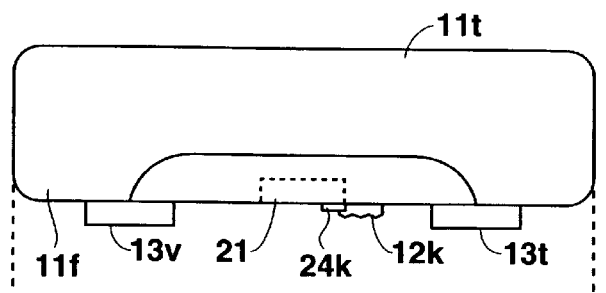
FIG. 5A and FIG. 5B are front and top side views showing configurations of the essential portion of the third embodiment of the device according to the present invention.
Figure 5B:
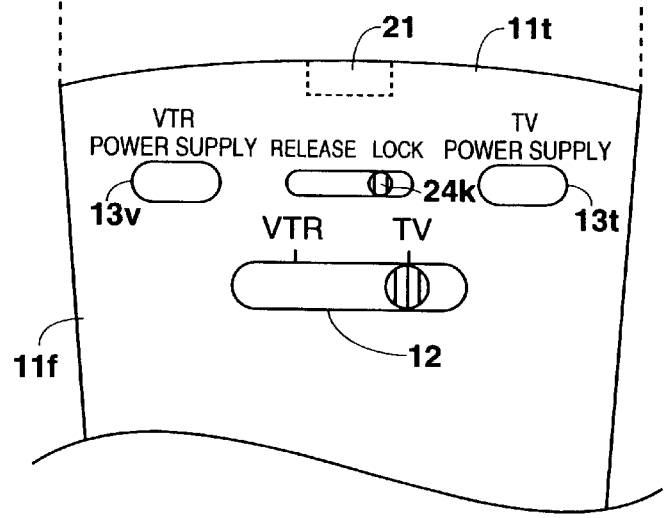

In FIG. 4, the essential portion of the remote commander 10A is shown with other portions being the same as for FIG. 1. Further, FIG. 5A and FIG. 5B show the third embodiment of the present invention, with FIG. 5A being an upper side view of a remote commander 10B and FIG. 5B being a front view of the essential portion of the remote commander 10B. Other portions are of the same structure as for FIG. 1. As shown in FIG. 5A and FIG. 5B, an operation knob 24k with a smaller projection compared with other operating keys is arranged for the slide type changeover switch at the front surface 11f of the case 11 of the remote commander 10B.

In the second and third embodiments, as in the first embodiment, the connection condition for the switch with the key 23k or the knob 24k are detected by the CPU 31 shown in FIG. 3 and the conversion table memory 34 is made to enter a locked state or a lock-released state.

In the second and third embodiments, the operation parts, i.e. the key 23k and the knob 24k are made to be smaller or less protruded compared with other operating keys. Therefore, they are less susceptible to collision with another object and, for example, even if a child plays with the remote commander as a toy, the key 23k and knob 24k of the switches cannot be touched and the mistaken release of manufacturer settings and the setting of undesired manufacturers can be prevented. This improves the remote commander in convenience as well as in reliability.

Fourth Embodiment

Next, a fourth embodiment of the remote control signal transmission device of the present invention will be described with reference to FIG. 6 and FIG. 7.

In this fourth embodiment, data relating to setting of the manufacturer for the remote commander is protected using software, unlike each of the above embodiments that protects the data using a switch as hardware.

This embodiment has therefore a hardware configuration for which the changeover switch 22 and the connection lines yr and ys are removed from the remote commander 10 of the first embodiment shown in FIG. 1 to FIG. 3.

Next, the process for locking the manufacturer setting of this embodiment will be described with reference to FIG. 6. In this embodiment, the manufacturer settings for a television receiver are also taken to be executed with the lock being released in the initial state.

In an initial step 101 of a manufacturer setting lock processing routine 100, a remote commander key operation by the user is waited. When any of the plurality of keys is operated, the process proceeds to the following step 102 and a determination is made as to whether or not the operated key is the TV power supply key 13*t*. When the operated key is not a TV power supply key, the process goes to step 103, where a processing corresponding to the operated key is carried out, and returns to step 101.

When the key operated in step 102 is the TV power supply key 13*t*, the process proceeds to step 104 and a determination is made as to whether or not there has been a new key operation within a prescribed time of, for example, about one second. When there is no new key operation within the prescribed time, the process goes to step 105, where a power supply on/off operation is carried out, and returns to step 101.

When there is a new key operation within the prescribed time in step 104, the process proceeds to step 106 and a determination is made as to whether or not the operated key is a specific key of the plurality of main function keys 14*a* to 14*f*, for example, the input changeover key 14*c*. When the operated key is not an input changeover key, the process goes to step 107, where a processing corresponding to the operated key is carried out, and returns to step 101.

When the key operated in step 106 is the input changeover key 14*c*, the process proceeds to step 108 and a determination is again made as to whether or not a new key operation has been made within the prescribed time. When there is no new key operation within the prescribed time, the process goes to steps 109 and 110, where a power supply on/off processing and an input changeover processing are carried out, and returns to step 101.

When there is a new key operation within the prescribed period of time in step 108, the process proceeds to step 111 and a determination is made as to whether or not the operated key was the channel up key 17*c*. When the operated key was the channel up key 17*c*, the process proceeds to the following step 112, where data locking processing relating to the manufacturer code settings is carried out, and returns to step 101.

When the TV power supply key 13*t*, the input changeover key 14*c* and the channel down key 17*d* are consecutively operated within prescribed periods of times in steps 101, 104 and 108, the process goes to step 113 via step 111. When the operated key is determined to be a channel down key 17*d*, the process proceeds to the following step 114, where processing to release the locking of data relating to the manufacturer code settings is carried out before the process returns to step 101.

When the key operated within a prescribed period of time in step 108 is neither of the channel up key or a channel down key, the process goes to step 115 via steps 111 and 113, and a processing corresponding to the operated key is carried out before the process returns to step 101.

Figure 6:
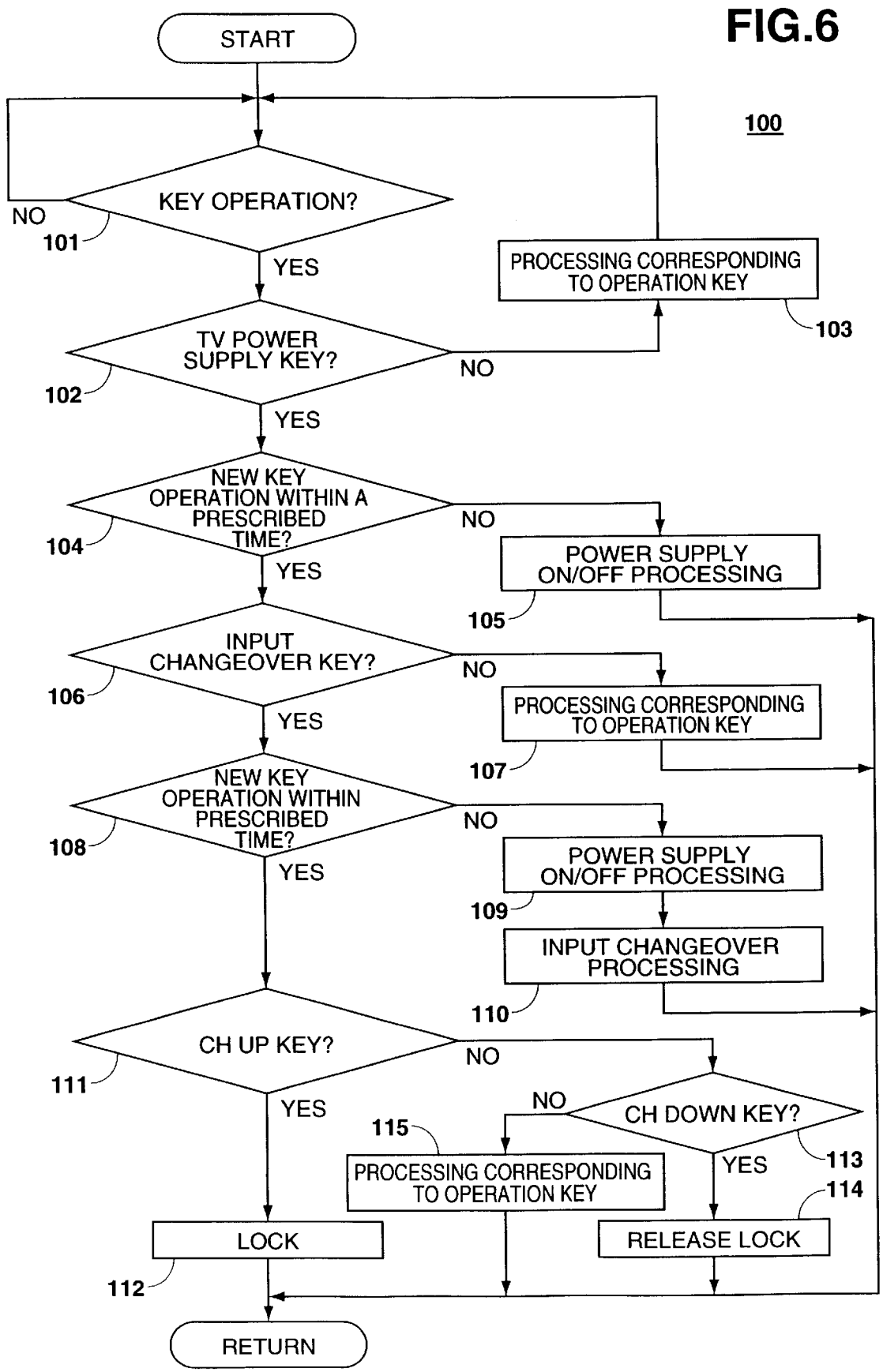
FIG. 6 is a flowchart illustrating the operation of the fourth embodiment of the present invention.

The manufacturer code setting change processing becomes possible as shown in following FIG. 7 in the case of releasing locking carried out as explained above in the manufacturer code setting lock processing routine 100 shown in FIG. 6.

That is, as shown in FIG. 7, a key operation by a user is waited in the first step 201 of a manufacturer code setting change processing routine 200. When any of a plurality of keys is operated, the process proceeds to the following step 202. A determination is then made as to whether or not this key operation is such a manufacturer code setting operation as described above where the power supply key and a numeric key are pressed simultaneously and the deciding key is then pressed. When this key operation is not a manufacturer code setting operation, the process goes to step 203, where a processing corresponding to the key operation is carried out, and returns to step 201.

When the key operation in step 202 is a manufacturer code setting operation, the process proceeds to step 204 where a determination is made as to whether or not the manufacturer setting is to be changed. When the manufacturer setting is to be changed, the process proceeds to the following step 205 and a determination is made as to whether or not the conversion table memory 34 is locked.

When the memory 34 is not locked, processing to change the manufacturer setting is carried out in the following steps 206 and 207, where the manufacturer setting is changed and the control code conversion table is updated before the process returns to step 201.

On the other hand, the process returns to step 201 without any changes being made when it is determined in step 204 that the manufacturer setting is not changed and when it is determined in step 205 that the remote commander is in a locked state.

As described above, in the fourth embodiment, the TV power supply key, the input changeover key and the channel up key are consecutively operated during lock release (at the time of manufacturer setting), and the TV power supply key, the input changeover key and the channel down key are consecutively operated during locking (when the manufacturer setting is held). However, as can be seen from FIG. 1 (the arrangement of the keys on the front surface of the remote commander for this fourth embodiment is the same as in FIG. 1), the operated keys are arranged away from each other rather than being close to each other, so that there is little possibility of these keys being operated consecutively in normal operation. Thus, erroneous release of the manufacturer settings or the setting of an undesired manufacturer can be avoided. This improves the remote commander in convenience as well as in reliability.

In the above example, a description has been given of manufacturer settings for the case where remote control signal code formats differ with each manufacturer. However, the present invention can be of course applied also to remote commanders for, for example, the same type television receivers made by the same manufacturer in the case where different remote control code formats have been used for different manufacturing periods and the remote commanders are equipped with memory for storing code conversion tables corresponding to the remote control codes for respective manufacturing periods.

What is claimed is:

1. A remote control signal transmission device comprising:

a plurality of operation keys;

operation key detecting means for detecting which of a plurality of said operation keys have been operated;

storage means for storing correspondence tables between said operation keys and remote control signals, each of said correspondence tables differing depending on an electronic apparatus taken as a remote control target;

setting means for setting an electronic apparatus as a remote control target, said setting means receiving a detection output of said operation key detecting means and, when simultaneous operation of a pre-defined plurality of said operation keys is detected as said detection output, selecting a correspondence table for an electronic apparatus corresponding to said simultaneous operation from within a plurality of said correspondence tables stored at said storage means;

means for generating a remote control signal corresponding to an operated key according to a correspondence table set by said setting means and transmitting said remote control signal to electronic apparatus taken as said control target; and setting protection means for protecting settings of said setting means, including a changeover key for changing over a locked state and a released state of said setting, provided inside a dry cell holder at a position that is covered by a dry cell holder cover forming a part of the outer surface of a case.

2. A remote control signal transmission device according to claim 1, which further comprises a selector for selecting one class of electronic devices among a plurality of classes of electronic devices.

3. A remote control signal transmission device according to claim 2, wherein said plurality of correspondence tables are divided into groups where each of said groups corresponds to one of said plurality of classes of electronic devices.

4. A remote control signal transmission device according to claim 3, wherein said correspondence table selected by said setting means is selected from a group corresponding to a class of electronic devices selected by said selector.

5. A remote control signal transmission device comprising:

a plurality of operation keys;

an operation key detector for detecting which of a plurality of said operation keys have been operated;

a memory for storing correspondence tables between said operation keys and remote control signals, each of said correspondence tables differing depending on an electronic apparatus taken as a remote control target;

setting means for setting an electronic apparatus as a remote control target, said setting means receiving a detection output of said operation key detecting means and, when simultaneous operation of a pre-defined plurality of said operation keys is detected as said detection output, selecting a correspondence table for an electronic apparatus corresponding to said simultaneous operation from within a plurality of said correspondence tables stored at said storage means;

a signal generator, generating a remote control signal corresponding to an operated key according to a correspondence table set by said setting means and transmitting said remote control signal to electronic apparatus taken as said control target; and a software program that protects and unprotects settings of said setting means by discerning consecutive operation of a specified plurality of operation keys.

6. A remote control signal transmission device according to claim 5, wherein said software program further discerns whether said specified plurality of operation keys are consecutively operated within in a specified amount of time.

7. A remote control signal transmission device according to claim 5, wherein said software program allows said signal generator to generate a remote control signal corresponding to a primary operation of an operation key when said software program discerns that simultaneous operation of a specified plurality of operation keys is not operated.

8. A method of using a remote control signal transmission device, which comprises the steps of:

storing in a memory correspondence tables between a plurality of operation keys and remote control signals, each of said correspondence tables differing depending on an electronic apparatus taken as a remote control target;

detecting which of a plurality of said operation keys have been operated by a user using a detector;

receiving a detection output from said detector and, when simultaneous operation of a pre-defined plurality of said operation keys is detected as said detection output, selecting a correspondence table for an electronic apparatus corresponding to said simultaneous operation from within a plurality of said correspondence tables stored in said memory;

generating a remote control signal corresponding to an operated key according to a selected correspondence table and transmitting said remote control signal to an electronic apparatus taken as said control target; and protecting against selecting of another correspondence table using a changeover key, for changing over a locked state and a released state of said selected correspondence table, wherein said changeover key is provided inside a dry cell holder at a position that is covered by a dry cell holder cover forming a part of the outer surface of a case.

9. A method according to claim 8, which further comprises the step of selecting one class of electronic devices among a plurality of classes of electronic devices using a selection switch.

10. A method according to claim 9, wherein said plurality of correspondence tables are divided into groups where each of said groups corresponds to one of said plurality of classes of electronic devices.

11. A remote control signal transmission device according to claim 10, wherein said correspondence table selected by said setting means is selected from a group corresponding to a class of electronic devices selected by said selector.

12. A method of using a remote control signal transmission device, which comprises the steps of:

storing in a memory correspondence tables between a plurality of operation keys and remote control signals, each of said correspondence tables differing depending on an electronic apparatus taken as a remote control target;

detecting which of a plurality of said operation keys have been operated by a user using a detector;

receiving a detection output from said detector and, when simultaneous operation of a pre-defined plurality of said operation keys is detected as said detection output, selecting a correspondence table for an electronic apparatus corresponding to said simultaneous operation from within a plurality of said correspondence tables stored in said memory;

generating a remote control signal corresponding to an operated key according to a selected correspondence table and transmitting said remote control signal to an electronic apparatus taken as said control target; and protecting and unprotecting against selecting of another correspondence table using a software program that discerns consecutive operation of a specified plurality of operation keys.

13. A remote control signal transmission device according to claim 12, wherein said software program further discerns whether said specified plurality of operation keys are consecutively operated within in a specified amount of time.

14. A remote control signal transmission device according to claim 13, wherein said software program allows said signal generator to generate a remote control signal corresponding to a primary operation of an operation key when said software program discerns that simultaneous operation of a specified plurality of operation keys is not operated.

* * * * *